(12) United States Patent
Bang et al.

(10) Patent No.: US 10,903,294 B2
(45) Date of Patent: Jan. 26, 2021

(54) DISPLAY DEVICE

(71) Applicant: SAMSUNG DISPLAY CO., LTD., Yongin-si (KR)

(72) Inventors: Ki Ho Bang, Yongin-si (KR); Nayun Kwak, Yongin-si (KR); Eunhye Kim, Yongin-si (KR); Sae bom Ahn, Yongin-si (KR); Seong Ryoung Lee, Yongin-si (KR); Sanghyun Jun, Yongin-si (KR); Wonsuk Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/682,098

(22) Filed: Nov. 13, 2019

(65) Prior Publication Data
US 2020/0168685 A1 May 28, 2020

(30) Foreign Application Priority Data
Nov. 26, 2018 (KR) .................. 10-2018-0147491

(51) Int. Cl.
*H01L 29/08* (2006.01)
*H01L 27/32* (2006.01)
*G06F 3/041* (2006.01)

(52) U.S. Cl.
CPC ........ *H01L 27/3258* (2013.01); *G06F 3/0412* (2013.01); *H01L 27/323* (2013.01); *H01L 27/3276* (2013.01)

(58) Field of Classification Search
CPC . H01L 27/32; H01L 27/3258; H01L 27/3276; H01L 51/107; G06F 3/044
See application file for complete search history.

(56) References Cited

U.S. PATENT DOCUMENTS

| 10,461,268 B2 | 10/2019 | Jiang et al. | |
| 2015/0255526 A1* | 9/2015 | Lee ..................... | H01L 51/5228 257/40 |
| 2017/0125734 A1* | 5/2017 | Lee ..................... | H01L 27/3246 |
| 2017/0345881 A1 | 11/2017 | Kim et al. | |

(Continued)

FOREIGN PATENT DOCUMENTS

| CN | 108417608 | 8/2018 |
| EP | 3 236 309 | 10/2017 |

(Continued)

OTHER PUBLICATIONS

Extended European Search Report corresponding to European Patent Application No. 19210873.6 dated Apr. 6, 2020.

*Primary Examiner* — Phuc T Dang
(74) *Attorney, Agent, or Firm* — Kile Park Reed & Houtteman PLLC

(57) ABSTRACT

A display device includes a display part including a plurality of pixels arranged on a substrate, a plurality of dams in a first peripheral part adjacent to the display part, the plurality of dams being extended in a longitudinal direction of the first peripheral part and arranged in a direction crossing the longitudinal direction, the plurality of dams including a stack of a first organic insulating layer and a second organic insulating layer, and a blocking part disposed between the plurality of dams and corresponding to a removed portion of the first and second organic insulating layers.

20 Claims, 9 Drawing Sheets

(56) References Cited

U.S. PATENT DOCUMENTS

2017/0358602 A1\* 12/2017 Bae .................. H05K 3/403
2017/0373270 A1   12/2017 Kim et al.
2018/0033832 A1\*  2/2018 Park .................. H01L 51/107

FOREIGN PATENT DOCUMENTS

| EP | 3 276 457 | 1/2018 |
| KR | 10-2015-0081728 A | 7/2015 |
| KR | 10-2015-0108469 A | 9/2015 |
| KR | 10-2018-0005097 A | 1/2018 |

\* cited by examiner

DISPLAY DEVICE

CROSS-REFERENCE TO RELATED APPLICATION

Korean Patent Application No. 10-2018-0147491, filed on Nov. 26, 2018, in the Korean Intellectual Property Office, and entitled: "Display Device," is incorporated by reference herein in its entirety.

BACKGROUND

1. Field

Embodiments relate to a display device.

2. Description of the Related Art

Display devices such as a liquid crystal display (LCD) device, an organic light emitting display (OLED) device, and an electrophoretic display device may include an electric field generating electrode and an electro-optic active layer. For example, the organic light emitting display device may include an organic light emitting layer as the electro-optical active layer. The electric field generating electrode may be connected to a switching element such as a thin film transistor to receive a data signal, and the electro-optic active layer may display an image by converting such a data signal into an optical signal.

SUMMARY

Embodiments are directed to a display device, including a display part including a plurality of pixels arranged on a substrate, a plurality of dams in a first peripheral part adjacent to the display part, the plurality of dams being extended in a longitudinal direction of the first peripheral part and arranged in a direction crossing the longitudinal direction, the plurality of dams including a stack of a first organic insulating layer and a second organic insulating layer, and a blocking part disposed between the plurality of dams and corresponding to a removed portion of the first and second organic insulating layers.

In an example embodiment, at least one power voltage line which transmits a power supply voltage applied to the plurality of pixels may be disposed in the first peripheral part, the at least one power voltage line may include a first source metal pattern and a second source metal pattern connected to the first source metal pattern through a contact hole formed in the first organic insulating layer, and the second organic insulating layer may be on the second source metal pattern.

In an example embodiment, the plurality of dams may include at least one first dam disposed in a dam area adjacent to the display part, a second dam disposed adjacent to the first dam, and a third dam disposed adjacent to the second dam.

In an example embodiment, the first, second and third dams may be on the at least one power voltage line and partially overlap with the at least one power voltage line.

In an example embodiment, the blocking part may be disposed in an area where the at least one power voltage line is not formed between the first dam and the second dam.

In an example embodiment, the blocking part may be disposed in an area where the at least one power voltage line is not formed between the second dam and the third dam.

In an example embodiment, each of the plurality of pixels may include a pixel circuit, the pixel circuit including a transistor including an active pattern, a gate electrode, a source electrode, and a drain electrode, an organic light emitting diode connected to the transistor, the organic light emitting diode including a pixel electrode, a light emitting layer, and a common electrode, and a pixel defining layer including an opening in which the light emitting layer is disposed, wherein the first and second organic insulating layers may be disposed between the source electrode and the pixel electrode.

In an example embodiment, each of the first, second and third dams may have a first height, and the first height may correspond to a stacked thickness of the first source metal pattern, the first organic insulating layer, the second source metal pattern, the second organic insulating layer, and the pixel defining layer.

In an example embodiment, the first dam having a first height and a step part having a second height lower than the first height may be disposed in the dam area, and wherein the step part may be adjacent to the display part and the first dam may be adjacent to the second dam.

In an example embodiment, the second height of the step part may correspond to a stacked thickness of the first or second source metal pattern, the first organic insulating layer, and the pixel defining layer.

In an example embodiment, a plurality of first dams having a first height, and a step part having a second height lower than the first height and disposed between the plurality of first dams may be disposed in the dam area.

In an example embodiment, the second height of the step part may correspond to a stacked thickness of the first source metal pattern, the first organic insulating layer, and the second source metal pattern.

In an example embodiment, the second height of the step part may correspond to a stacked thickness of the first or second source metal pattern, the first organic insulating layer, and the pixel defining layer.

In an example embodiment, the display device may further include an encapsulation layer on the common electrode of the display part.

In an example embodiment, the encapsulation layer may be sequentially stacked with an inorganic layer, an organic layer and an inorganic layer.

In an example embodiment, the display device may further include a first touch electrode of a touch sensor on the encapsulation layer of the display part, a second touch electrode of the touch sensor on the first touch electrode of the display part, and an interlayer insulating layer disposed between the first touch electrode and the second touch electrode.

In an example embodiment, the substrate may include a plurality of plastic layers.

In an example embodiment, the display device may further include a pad part located at the first peripheral part and including a plurality of pads connected to an external circuit film, and a bending part located at the first peripheral portion between the display portion and bending.

In an example embodiment, the plurality of dams is disposed between the display part and the bending part.

In an example embodiment, the display device may further include a valley part disposed in a second peripheral part surrounding the display part except for the first peripheral part, and removed the first and second organic insulating layers in second peripheral part.

According to the example embodiments, the display device includes the plurality of dams to prevent the organic layer of the encapsulation layer from flowing to an edge portion of the display device, and a blocking part from which the organic layer is removed in an area between the plurality of dams. Accordingly, the outside air such as moisture and oxygen may be prevented from flowing into the display part inside the display device through the organic layer and the organic layer formed on the edge portion of the display device.

BRIEF DESCRIPTION OF THE DRAWINGS

Features will become apparent to those of skill in the art by describing in detail example embodiments with reference to the attached drawings in which.

DETAILED DESCRIPTION

Figure 1:
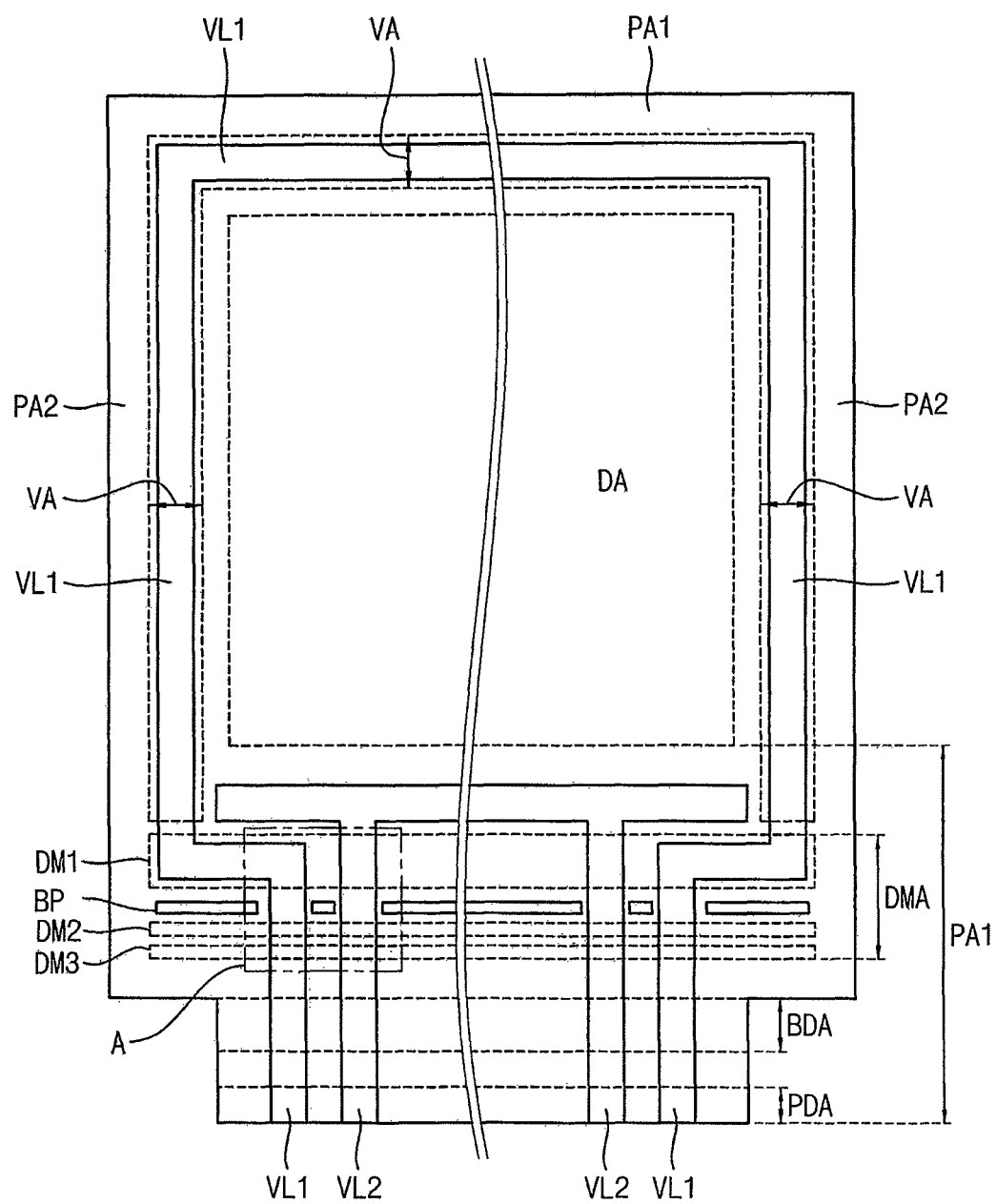
FIG. 1 illustrates a plan view of a display device according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

Figure 2:
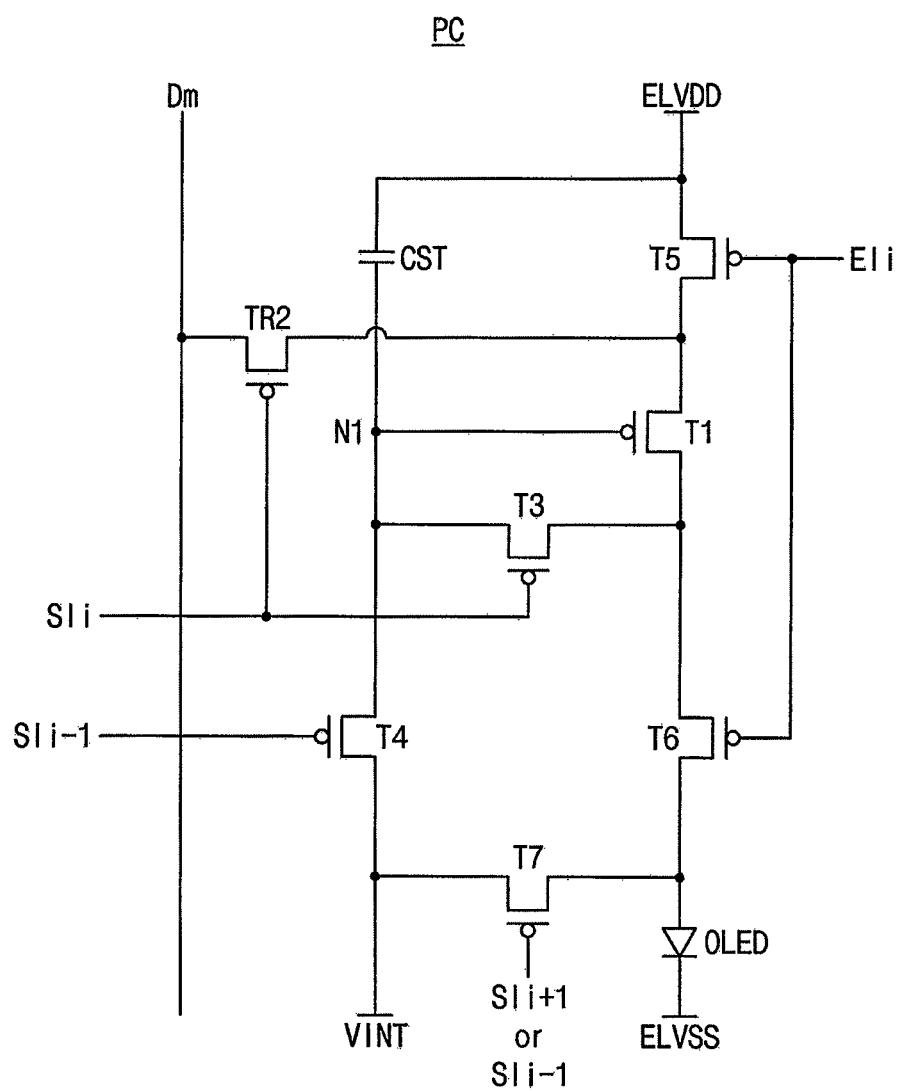
FIG. 2 illustrates a pixel circuit diagram of a pixel of the display device of FIG. 1.

FIG. 1 is a plan view illustrating a display device according to an example embodiment. FIG. 2 is a pixel circuit diagram illustrating a pixel of the display device of FIG. 1.

Referring to FIG. 1, the display device may include a display part DA for displaying an image and a first peripheral part PA1 and a second peripheral part PA2 which are non-display parts surrounding the display part DA.

A plurality of pixels may be arranged in the display part DA, and each pixel may include a pixel circuit.

Referring to FIG. 2, the pixel circuit PC may include an organic light emitting diode OLED, a first transistor T1 to a seventh transistor T7, and a storage capacitor CST.

In the present example embodiment, an anode of the organic light emitting diode OLED is connected to the first transistor T1 through a sixth transistor T6. A cathode of the organic light emitting diode OLED may be connected to a second power supply voltage ELVSS. The organic light emitting diode OLED may generate a light of a predetermined luminance corresponding to a current applied from a first transistor T1.

A first power supply voltage ELVDD may be set to a voltage higher than the second power supply voltage ELVSS so that the current may flow through the organic light emitting diode OLED.

A seventh transistor T7 may be connected between an initialization voltage Vint and the anode of the organic light emitting diode OLED. A gate electrode of the seventh transistor T7 may be connected to an (i+1)-th scan line Sli+1 or an (i−1)-th scan line Sli−1 ('i' is a natural number). The seventh transistor T7 may be turned on when a scan signal is applied to an i-th scan line Sli, the seventh transistor T7 supplies an initialization voltage Vint to the anode of the organic light emitting diode OLED. The initialization voltage Vint may be set to a lower voltage than a data voltage.

A sixth transistor T6 may be connected between the first transistor T1 and the organic light emitting diode OLED. A gate electrode of the sixth transistor T6 may be connected to an i-th emission control line Eli. The sixth transistor T6 may be turned on when the emission control signal is applied to the i-th emission control line Eli.

A fifth transistor T5 may be connected between the first power supply voltage ELVDD and the first transistor T1. A gate electrode of the fifth transistor T5 may be connected to the i-th emission control line Eli. The fifth transistor T5 may be turned on when the emission control signal is applied to the i-th emission control line Eli.

A first electrode of the first transistor T1 is connected to the first power supply voltage ELVDD through the fifth transistor T5, and a second electrode of the first transistor T1 is connected to the anode of the organic light emitting diode OLED through the sixth transistor T6. A gate electrode of the first transistor T1 may be connected to the first node N1. Thus, the first transistor T1 may control an amount of current flowing from the first power supply voltage ELVDD to the second power supply voltage ELVSS via the organic light emitting diode OLED corresponding to the voltage of the first node N1.

The third transistor T3 may be connected between the second electrode of the first transistor T1 and the first node N1. A gate electrode of the third transistor T3 may be connected to the i-th scan line Sli. Thus, when a scan signal is supplied to the i-th scan line Sli, the third transistor T3 is turned on and the second electrode of the first transistor T1 is electrically connected to the first node N1. Accordingly, when the third transistor T3 is turned on, the first transistor T1 may be connected in a diode form.

The fourth transistor T4 may be connected between the first node N1 and the initialization voltage Vint. A gate electrode of the fourth transistor T4 may be connected to the (i−1)-th scan line Sli−1. Thus, when the scan signal is applied to the (i−1)-th scan line Sli−1, the fourth transistor T4 is turned on and applies the initialization voltage Vint to the first node N1.

The second transistor T2 may be connected between an m-th data line Dm and the first electrode of the first transistor T1. A gate electrode of the second transistor T2 may be connected to the i-th scan line Sli. Thus, when a scan signal is applied to the i-th scan line Sli, the second transistor T2 is turned on and the first electrode of the first transistor T1 and the m-th data line Dm are electrically connected.

The storage capacitor CST may be connected between the first power supply voltage ELVDD and the first node N1. Thus, the storage capacitor CST may store a data voltage and a voltage corresponding to a threshold voltage of the first transistor T1.

The first peripheral part PA1 may correspond to a lower area or an upper area of the display part DA.

A first power voltage line VL1 and a second power voltage line (VL2) may be disposed in the first peripheral part PA1. The first power voltage line VL1 is configured to transmit a first power supply voltage ELVDD to the pixel circuit PC. The second power voltage line VL2 is configured to transmit a second power supply voltage ELVSS to the pixel circuit PC.

The first peripheral part PA1 may include a dam part DMA, a blocking part BP, a bending part BDA, and a pad part PDA.

The dam part DMA may include a plurality of dams, for example, dams DM1, DM2 and DM3. The plurality of dams DM1, DM2 and DM3 may block an organic material of an encapsulation layer used for sealing the display part DA from flowing toward an edge portion of the substrate. The plurality of dams DM1, DM2, and DM3 may prevent an edge tail of the organic material from being formed.

The edge tail refers to an edge portion of an organic layer that flows outward beyond an edge portion of an inorganic layer. Generally, to form the encapsulation layer, when forming an organic layer and an inorganic layer, a pattern may be formed by placing a mask corresponding to the layer on a substrate. At this time, the organic layer may penetrate into a gap between the mask and the substrate to form the edge tail. The edge tail may result in penetration of outside air such as oxygen or moisture into the display part DA.

In the present example embodiment, the blocking part BP is a portion where organic layers (made of organic materials) are removed to prevent penetration of outside air such as moisture or oxygen through the organic layers.

The blocking part BP may be formed in an area between the plurality of dams DM1, DM2, and DM3.

In an example embodiment, the blocking part BP may be formed in an area between the first dam DM1 and the second dam DM2.

In another implementation, the blocking part BP may be formed in an area between the second dam DM2 and the third dam DM3.

The bending part BDA is an area where the display device may be bent, for example, though a module assembling process. The display device may include a flexible substrate, and the display device may be bent in the bending part BDA.

The pad part PDA may include a plurality of pads disposed in an edge portion of the first peripheral part PA1 and connected to a plurality of signal lines arranged in the display device. The plurality of pads may be connected to an external circuit film, for example, a chip on film (COF) in the module assembling process.

The second peripheral part PA2 may be an area surrounding the display part DA except the first peripheral part PA1. For example, the second peripheral part PA2 may include an upper area of the display part DA facing the first peripheral part PA1 and a left area and a right area of the display part DA.

The first power voltage line VL1 may be disposed in the second peripheral part PA2.

The second peripheral part PA2 may include a valley part VA.

The valley part VA may be formed corresponding to an area where the first power voltage line VL1 is formed. The valley part VA may be an area where the organic layer is removed in order to prevent the outside air such as the moisture or the oxygen from penetrating into the display part DA through an insulating film made of organic material.

Figure 3:
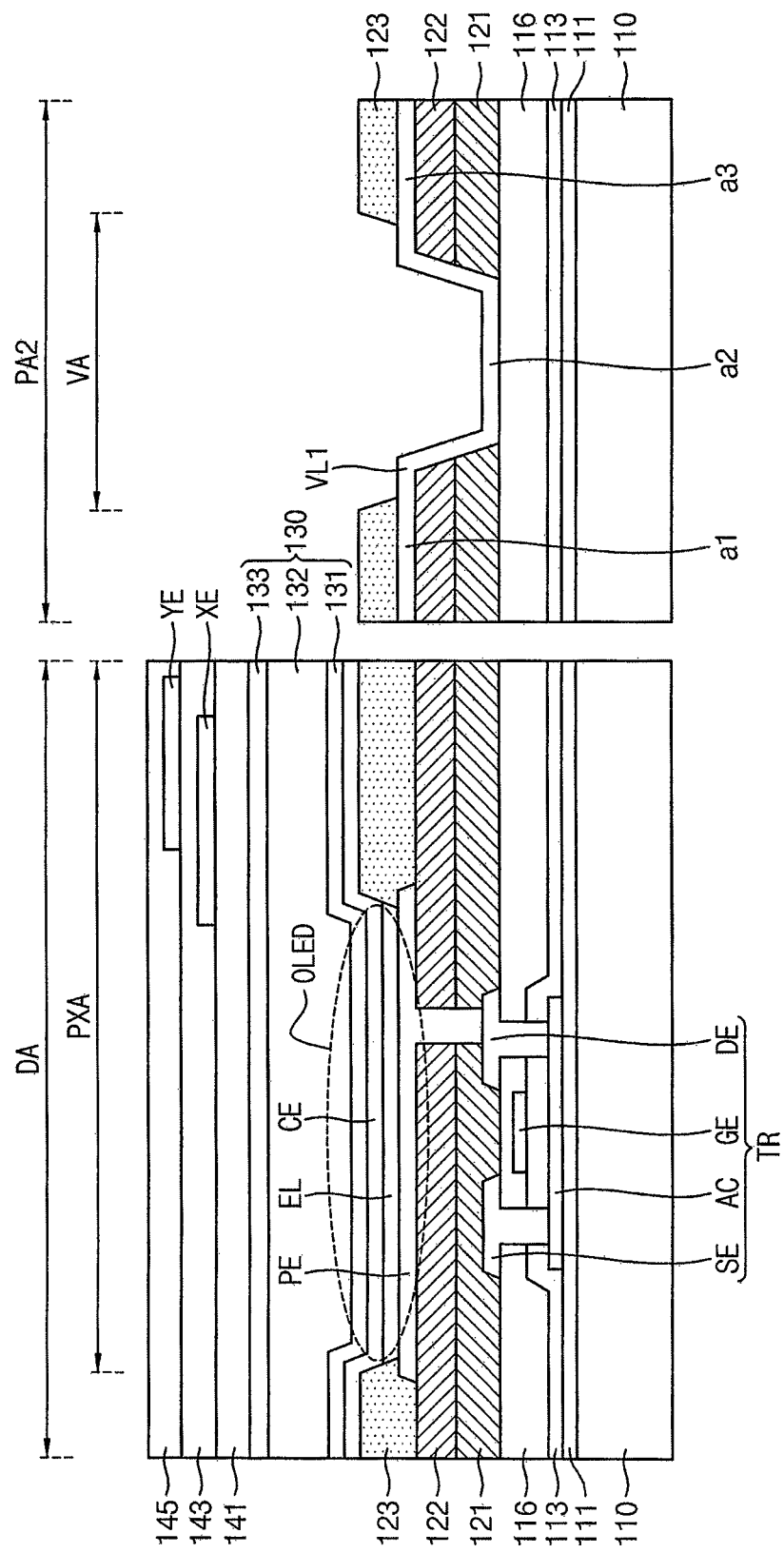
FIG. 3 illustrates a cross-sectional view of a display device of a display part and a first peripheral part of FIG. 1.

FIG. 3 is a cross-sectional view of a display device illustrating a display part and a first peripheral part of FIG. 1.

Referring to FIGS. 1, 2 and 3, the display device may include the display part DA and the second peripheral part PA2 on a substrate 110.

The substrate 110 may include a first transparent plastic layer, a colored plastic layer, and a second transparent plastic layer that are sequentially stacked. For example, the plastic layer may be formed of a material selected from a group consisting of polyimide (PI), polyethylene naphthalate (PEN), polyethylene terephthalate (PET), polyarylate (PAR), polycarbonate (PC), polyetherimide (PEI), polyethersulfone (PS), and the like.

The display part DA may include a pixel area PXA having a transistor TR connected to the organic light emitting diode OLED, a first touch electrode XE, and a second touch electrode YE.

The display device may further include a buffer layer 111, a gate insulating layer 113, a first interlayer insulating layer 116, a first organic insulating layer 121, a second organic insulating layer 122, a pixel definition layer 123 an encapsulation layer 130, a planarization layer 141, a second interlayer insulating layer 143, and a passivation layer 145.

The transistor TR may include an active pattern AC, a gate electrode GE, a source electrode SE, and a drain electrode DE. The gate electrode GE may be a gate metal pattern patterned from a gate metal layer and the source and drain electrodes SE and DE may be source metal patterns patterned form a source metal layer.

The gate insulating layer 113 may be disposed between the active pattern AC and the gate electrode GE. The first interlayer insulating layer 116 may be disposed between the gate electrode GE and the source/drain electrodes SE and DE.

The organic light emitting diode OLED may include a pixel electrode PE, a light emitting layer EL, and a common electrode CE. The pixel electrode PE may be connected to the drain electrode DE of the transistor TR through a contact hole formed in the first and second organic insulating layers 121 and 122. The light emitting layer EL may be on the pixel electrode PE in an opening formed in the pixel definition layer 123. The common electrode CE may be on the light emitting layer EL in the display part DA. The pixel definition layer 123 may include an organic material such as an acrylic resin, an epoxy resin, a polyimide resin, and a polyester resin.

The encapsulation layer 130 may be on the common electrode CE.

The encapsulation layer 130 may seal the light emitting layer EL and the common electrode CE to prevent moisture and/or oxygen from penetrating from the outside. The encapsulation layer 130 may include a plurality of encapsulation layers. The encapsulation layer 130 may include a sequential stack of an inorganic layer 131, an organic layer 132, and an inorganic layer 133. The inorganic layers 131 and 133 may include inorganic materials such as aluminum oxide, silicon oxide, and silicon nitride. The organic layer 132 may include an organic material and may have a thickness for planarization.

Among the plurality of encapsulation layers, the encapsulation layer located at the top may be an inorganic layer or an organic layer. When an uppermost encapsulation layer is the inorganic layer, the encapsulation layer 130 may block moisture well. The inorganic layer included in the encapsulation layer 130 may cover the organic layer disposed below the inorganic layer so that the organic layer is not exposed to the outside. The organic layer of the encapsulation layer 130 may be covered with the inorganic layer to prevent penetration of the outside air through the organic layer.

The encapsulation layer 130 may cover an entire surface of the display part DA, and may cover a portion of the first and second peripheral parts PA1 and PA2.

The planarization layer 141 may be on the encapsulation layer 130 to planarize an upper surface of the substrate 110.

The first touch electrode XE may be on the planarization layer 141 and may be a first electrode of the touch sensor.

The second touch electrode YE may be a second electrode of the touch sensor.

A second interlayer insulating layer 143 may be disposed between the first touch electrode XE and the second touch electrode YE.

The passivation layer 145 may be on the second touch electrode YE.

The second peripheral part PA2 may include a valley part VA defined in an area where the first power voltage line VL1 is formed.

The first power voltage line VL1 may include a first portion a1, a second portion a2 and a third portion a3 along a width direction intersecting a longitudinal direction. The first portion a1 may be on the second organic insulating layer 122 of the second peripheral part PA2. The second portion a2 may be connected to the first portion a1 and on the substrate 110 in the valley area from which the first and second organic insulating layers 121 and 122 are removed. The third portion a3 may be connected to the second portion a2 and on a second organic insulating layer 122 of the second peripheral part PA2.

The pixel definition layer 123 may be on the first and third portions a1 and a3 of the first power voltage line VL1. The pixel definition layer 123 may be removed corresponding to the valley part VA.

The valley part VA of the second peripheral part PA2 may block the outside air such as the moisture and the oxygen from entering the pixel area DA through the first and second organic insulating layers 121 and 122 and the pixel definition layer 123.

Figure 4:
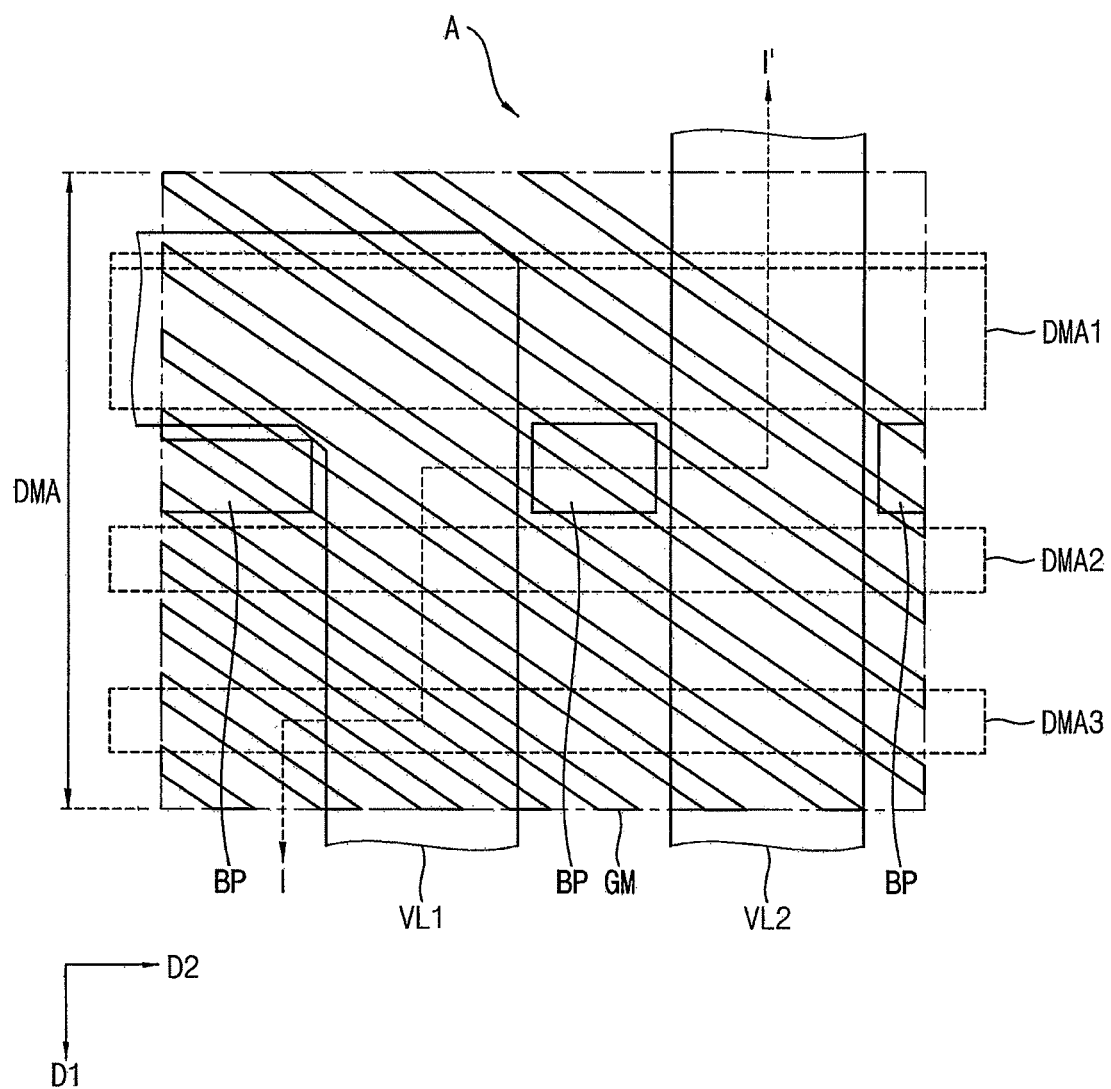
FIG. 4 illustrates an enlarged view of a portion A corresponding to a second peripheral part in FIG. 1.
Figure 5:
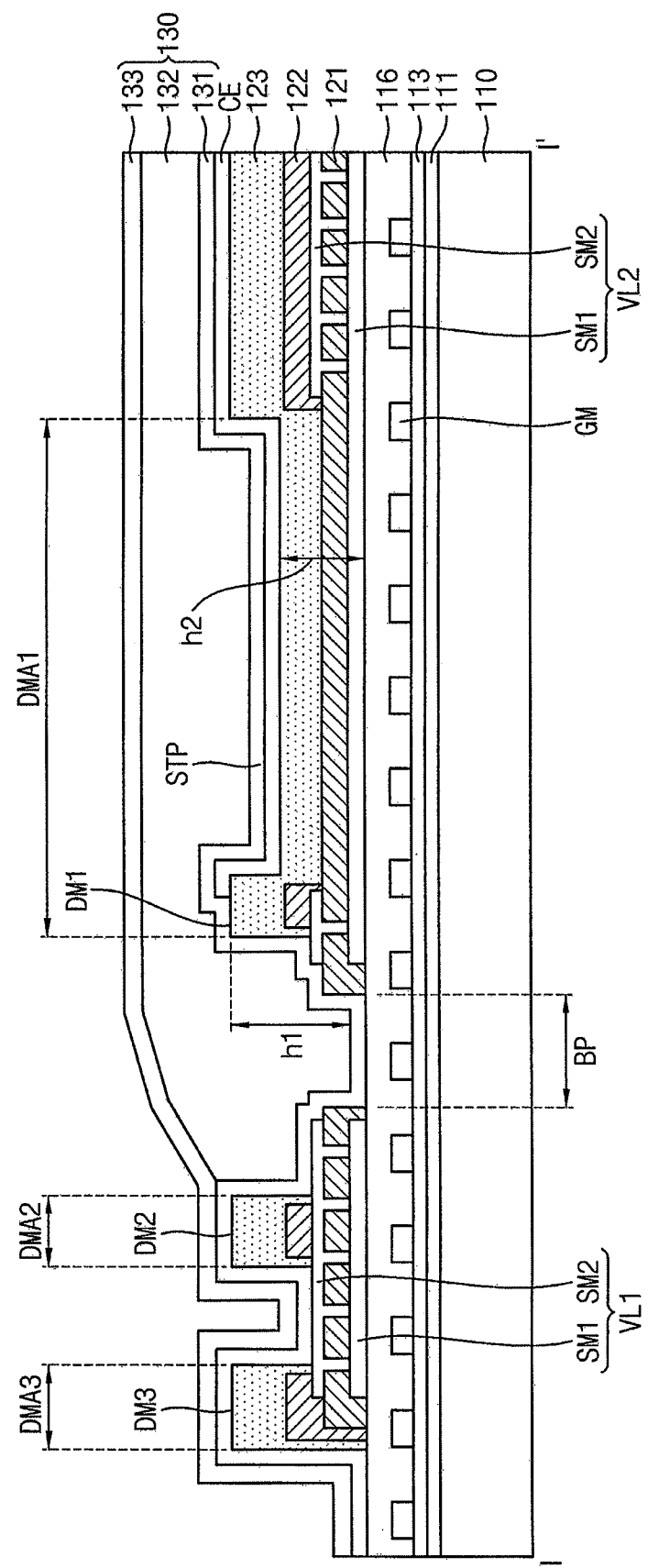
FIG. 5 illustrates a cross-sectional view of the display device taken along a line I-I' in FIG. 4.
Figure 6:
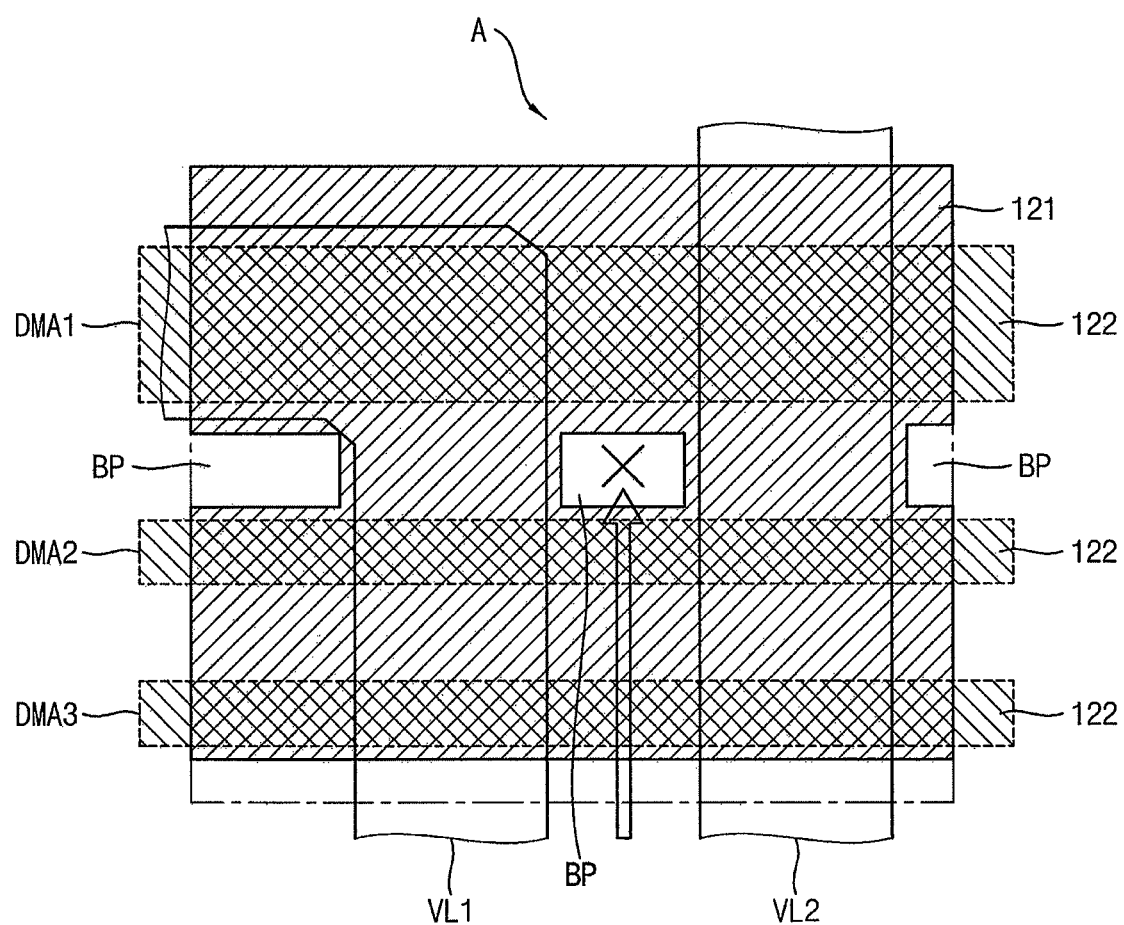
FIG. 6 illustrates a plan view of a first organic insulating layer and a second organic insulating layer in the portion A of FIG. 1.

FIG. 4 is an enlarged view illustrating a portion A corresponding to a second peripheral part in FIG. 1. FIG. 5 is a cross-sectional view illustrating the display device taken along a line I-I' in FIG. 4. FIG. 6 is a plan view illustrating a first organic insulating layer and a second organic insulating layer in the portion A of FIG. 1.

Referring to FIGS. 4 and 5, the dam part DMA may be disposed in the first peripheral part PA1 adjacent to the display part DA.

The first power voltage line VL1 and the second power voltage line VL2 may be disposed in the first peripheral part PA1.

The first power voltage line VL1 and the second power voltage line VL2 may include a first source metal pattern SM1 and a second source metal pattern SM2. The second source metal pattern SM2 may be connected to the first source metal pattern SM1 through a contact hole formed in the first organic insulating layer 121.

The dam part DMA may be formed on the first power voltage line VL1 and the second power voltage line VL2, and may overlap with the first power voltage line VL1 and the second power voltage line VL2.

The dam part DMA may be disposed in the first peripheral part PA1 adjacent to the display part DA in a first direction D1, and may extend in a second direction D2 crossing the first direction D1. The dam part DMA may be disposed between the display part DA and the pad part PDA.

In an example embodiment, referring to FIG. 1, the dam part DMA may be disposed between the display part DA and the bending part BDA.

The dam part DMA may include a first dam area DMA1 adjacent to the display part DA in the first direction D1, a second dam area DMA2 adjacent to the first dam area DMA1 in the first direction D1, and a third dam area DMA3 adjacent to the second dam area DMA2 in the first direction D1.

In an example embodiment, the dam part DMA may include a blocking part BP in which the first and second organic insulating layers 121 and 122 are removed between the first dam area DMA1 and the second dam area DMA2.

At least one first dam DM1 may be disposed in the first dam area DMA1 and may extend in the second direction D2.

At least one second dam DM2 may be disposed in the second dam area DMA2, may be adjacent to the at least one first dam DM1 in the first direction D1, and may extend in the second direction D2.

At least one third dam DM3 may be disposed in the third dam area DMA3, may be adjacent to the at least one second dam DM2 in the first direction D1, and may extend in the second direction D2.

Each of the first, second, and third dams DM1, DM2, and DM3 may have a structure in which at least two layers of the first organic insulating layer 121, the second organic insulating layer 122, and the pixel definition layer 123 are stacked.

The first, second, and third dams DM1, DM2, and DM3 of the dam part DMA may block the organic layer 132 of the encapsulation layer 130 for sealing the display part DA from flowing toward the edge portion of the display device.

In an example embodiment, the first dam area DMA1 may include a first dam DA1 and a step part STP. The step part STP may have a second height h2 lower than the first height h1 of the first dam DA1.

The first dam DM1 and the step part STP may be on the first interlayer insulating layer 116. A lower layer structure of the first interlayer insulating layer 116 may include a buffer layer 111, a gate insulating layer 113 and a gate metal pattern GM sequentially stacked on the substrate 110.

A first height h1 of the first dam DM1 may be determined as a stacked thickness of a first source metal pattern SM1, a first organic insulating layer 121, a second source metal pattern SM2, a second organic insulating layer 122 and the pixel definition layer 123.

A second height h2 of the step part STP may be determined as a stacked thickness of one of the first and second source metal patterns SM1 and SM2, the first organic insulating layer 121 and the pixel definition layer 122 in an area where the first and second power voltage lines VL1 and VL2 are formed. The second height h2 of the step part STP may be determined as a stacked thickness of the first organic insulating layer 121 and the pixel definition layer 122 in an area where the first and second power voltage lines VL1 and VL2 are not formed.

The second dam DM2 may be disposed in the second dam area DMA2.

The second dam DM2 may be on the first interlayer insulating layer 116. A lower layer structure of the first interlayer insulating layer 116 may include a buffer layer 111, a gate insulating layer 113 and a gate metal pattern GM sequentially stacked on the substrate 110.

A first height of the second dam DM2 may be determined as a stacked thickness of a first source metal pattern SM1, a first organic insulating layer 121, a second source metal pattern SM2, a second organic insulating layer 122, and the pixel definition layer 123.

The third dam DM3 may be disposed in the third dam area DMA3.

The third dam DM3 may be on the first interlayer insulating layer 116. A lower layer structure of the first interlayer insulating layer 116 may include a buffer layer 111, a gate insulating layer 113, and a gate metal pattern GM sequentially stacked on the substrate 110.

A first height of the third dam DM3 may be determined as a stacked thickness of a first source metal pattern SM1, a first organic insulating layer 121, a second source metal pattern SM2, a second organic insulating layer 122, and the pixel definition layer 123.

The organic layer 132 of the encapsulation layer 130 may be prevented from flowing to the edge portion of the display device by the step part STP and the first dam DM1 of the first dam area DMA1. In addition, the organic layer 132 of the encapsulation layer 130 may be prevented from flowing to the edge portion of the display device by the second dam DM2 of the second dam area DMA2. In addition, the organic layer 132 of the encapsulation layer 130 may be prevented from flowing to the edge portion of the display device by the third dam DM3 of the third dam area DMA3.

In an example embodiment, referring to FIGS. 4 and 6, the blocking part BP from which the first and second organic insulating layers 121 and 122 are removed may be formed in an area between the first dam area DMA1 and the second dam area DMA2. The blocking part BP may be formed in an area where the first and second power voltage lines VL1 and VL2 are not formed between the first dam area DMA1 and the second dam area DMA2.

As described above, the outside air such as moisture and oxygen may be blocked from entering the display part DA in the area between the first dam area DMA1 and the second dam area DMA2. For example, the outside air may be blocked from entering the display part DA by the first and second source metal patterns of the first and second power voltage lines VL1 and VL2, in an area where the first and second power voltage lines VL1 and VL2 are formed. In addition, the outside air may be blocked from entering the display part DA by the blocking part BP from which the first and second organic insulating layers 121 and 122 are removed, in an area where the first and second power voltage lines VL1 and VL2 are not formed.

Figure 7:
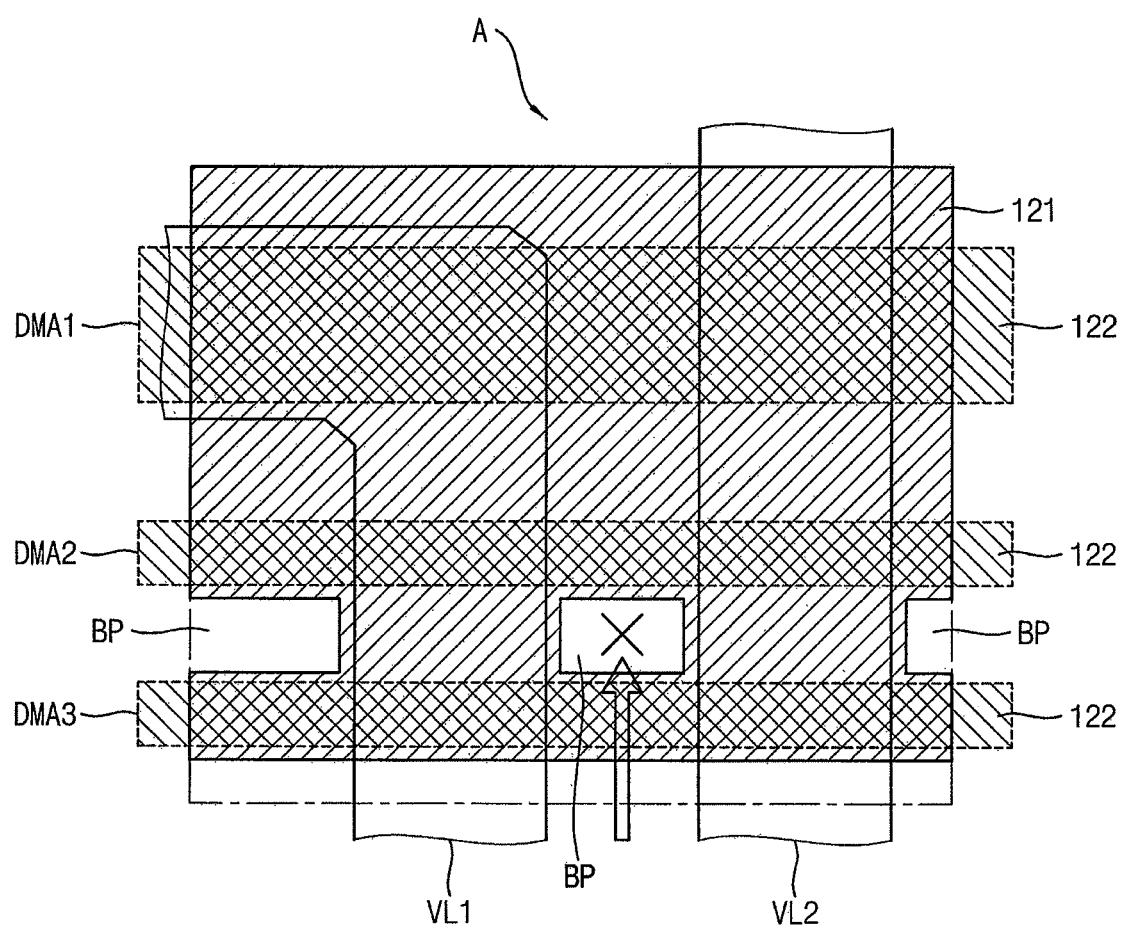
FIG. 7 illustrates a plan view of a first organic insulating layer and a second organic insulating layer in the portion A of FIG. 1 according to an example embodiment.

FIG. 7 is a plan view illustrating a first organic insulating layer and a second organic insulating layer in the portion A of FIG. 1 according to an example embodiment.

Referring to FIG. 7, in an example embodiment, the blocking part BP from which the first and second organic insulating layers 121 and 122 are removed may be formed in an area between the second dam area DMA2 and the third dam area DMA3. The blocking part BP may be formed in an area where the first and second power voltage lines VL1 and VL2 are not formed between the second dam area DMA2 and the third dam area DMA3.

The outside air such as the moisture and the oxygen may be blocked from entering the display part DA in the area between the first dam area DMA1 and the second dam area DMA2. For example, the outside air may be blocked from entering the display part DA by the first and second source metal patterns of the first and second power voltage lines VL1 and VL2, in an area where the first and second power voltage lines VL1 and VL2 are formed. In addition, the outside air may be blocked from entering the display part DA by the blocking part BP from which the first and second organic insulating layers 121 and 122 are removed, in an area where the first and second power voltage lines VL1 and VL2 are not formed.

Hereinafter, the same reference numerals are used to refer to the same or like parts as those described in the previous example embodiments, and the same detailed explanations are not repeated unless necessary for clarity.

Figure 8:
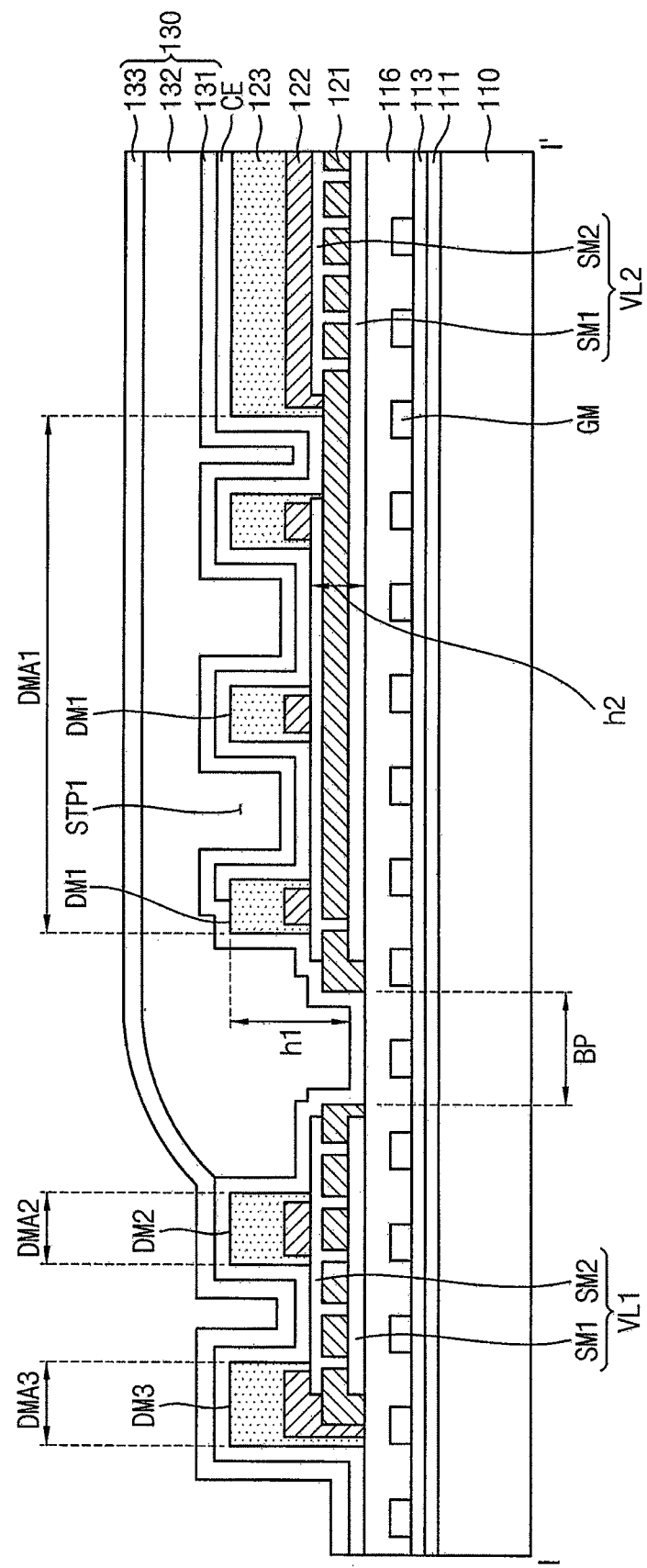
FIG. 8 illustrates a cross-sectional view of a display device according to an example embodiment.

FIG. 8 is a cross-sectional view illustrating a display device according to an example embodiment.

Referring to FIGS. 4 and 8, the dam part DMA may be disposed in the first peripheral part PA1 adjacent to the display part DA.

The first power voltage line VL1 and the second power voltage line VL2 may be disposed in the first peripheral part PA1. The first power voltage line VL1 and the second power voltage line VL2 may include a first source metal pattern SM1 and a second source metal pattern SM2. The second source metal pattern SM2 is connected to the first source metal pattern SM1 through a contact hole formed in the first organic insulating layer 121.

The dam part DMA may be disposed in the first peripheral part PA1 adjacent to the display part DA in a first direction D1, and may extend in a second direction D2 crossing the first direction D1.

In an example embodiment, the dam part DMA may be disposed between the display part DA and the pad par PDA.

The dam part DMA may include the first dam area DMA1 adjacent to the display part DA in the first direction D1, the second dam area DMA2 adjacent to the first dam area DMA1 in the first direction D1, and the third dam area DMA3 adjacent to the second dam area DMA2 in the first direction D1.

In an example embodiment, the dam part DMA may include the blocking part BP in which the first and second organic insulating layers 121 and 122 are removed between the first dam area DMA1 and the second dam area DMA2.

In an example embodiment, the dam part DMA may include the blocking part BP in which the first and second organic insulating layers 121 and 122 are removed between the second dam area DMA2 and the third dam area DMA3.

At least one first dam DM1 may be disposed in the first dam area DMA1 and may extend in the second direction D2.

At least one second dam DM2 may be disposed in the second dam area DMA2, may be adjacent to the at least one first dam DM1 in the first direction D1, and may extend in the second direction D2.

At least one third dam DM3 may be disposed in the third dam area DMA3, may be adjacent to the at least one second dam DM2 in the first direction D1, and may extend in the second direction D2.

In an example embodiment, as shown in FIG. 8, the first dam area DMA1 may include a plurality of first dams DM1 and a plurality of step parts STP1.

The plurality of first dams DM1 and the plurality of step parts STP1 may be on the first interlayer insulating layer 116. A lower layer structure of the first interlayer insulating layer 116 may include a buffer layer 111, a gate insulating layer 113 and a gate metal pattern GM sequentially stacked on the substrate 110.

The first height h1 of the first dam DM1 may be determined as a stacked thickness of the first source metal pattern SM1, the first organic insulating layer 121, the second source metal pattern SM2, the second organic insulating layer 122 and the pixel definition layer 123.

The second height h2 of the step part STP1 may be determined as a stacked thickness of the first and second source metal patterns SM1 and SM2 and the first organic insulating layer 121 between the first and second source metal patterns SM1 and SM2.

The second dam DM2 may be disposed in the second dam area DMA2.

The second dam DM2 may be on the first interlayer insulating layer 116. A lower layer structure of the first interlayer insulating layer 116 may include a buffer layer 111, a gate insulating layer 113 and a gate metal pattern GM sequentially stacked on the substrate 110.

A first height of the second dam DM2 may be determined as a stacked thickness of a first source metal pattern SM1, a first organic insulating layer 121, a second source metal pattern SM2, a second organic insulating layer 122, and the pixel definition layer 123.

The third dam DM3 may be disposed in the third dam area DMA3.

The third dam DM3 may be on the first interlayer insulating layer 116. A lower layer structure of the first interlayer insulating layer 116 may include a buffer layer 111, a gate insulating layer 113, and a gate metal pattern GM sequentially stacked on the substrate 110.

A first height of the third dam DM3 may be determined as a stacked thickness of a first source metal pattern SM1, a first organic insulating layer 121, a second source metal pattern SM2, a second organic insulating layer 122, and the pixel definition layer 123.

The organic layer 132 of the encapsulation layer 130 may be prevented from flowing to the edge portion of the display device by the step part STP1 and the first dam DM1 of the first dam area DMA1. In addition, the organic layer 132 of the encapsulation layer 130 may be prevented from flowing to the edge portion of the display device by the second dam DM2 of the second dam area DMA2. In addition, the organic layer 132 of the encapsulation layer 130 may be prevented from flowing to the edge portion of the display device by the third dam DM3 of the third dam area DMA3.

According to an example embodiment, a display device includes a blocking part in which the organic layer is removed from an area between a first dam area and a second dam area, or between the second dam area and a third dam area. Therefore, the outside air such as moisture and oxygen may be prevented from entering the display part through the organic layer and the organic layer formed on the edge portion of the display device.

Figure 9:
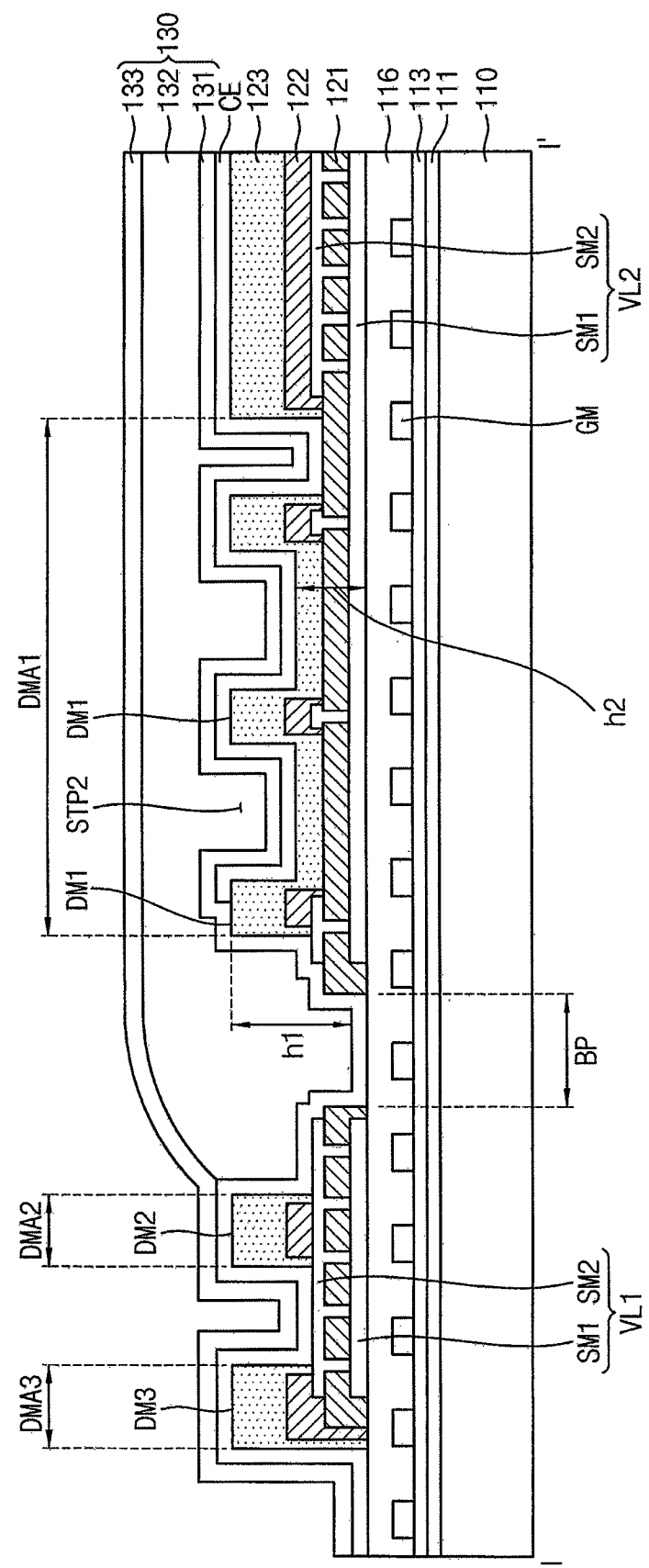
FIG. 9 illustrates a cross-sectional view of a display device according to an example embodiment.

FIG. 9 is a cross-sectional view illustrating a display device according to an example embodiment.

Referring to FIGS. 4 and 9, the dam part DMA may be disposed in the first peripheral part PA1 adjacent to the display part DA.

The first power voltage line VL1 and the second power voltage line VL2 may be disposed in the first peripheral part PA1. The first power voltage line VL1 and the second power voltage line VL2 may include the first source metal pattern SM1 and the second source metal pattern SM2. The second source metal pattern SM2 may be connected to the first source metal pattern SM1 through a contact hole formed in the first organic insulating layer 121.

The dam part DMA may be disposed in the first peripheral part PA1 adjacent to the display part DA in a first direction D1, and may extends in a second direction D2 crossing the first direction D1. The dam part DMA may be disposed between the display part DA and the pad part PDA.

The dam part DMA may include the first dam area DMA1 adjacent to the display part DA in the first direction D1, the second dam area DMA2 adjacent to the first dam area DMA1 in the first direction D1, and the third dam area DMA3 adjacent to the second dam area DMA2 in the first direction D1.

In an example embodiment, the dam part DMA may include the blocking part BP in which the first and second organic insulating layers 121 and 122 are removed between the first dam area DMA1 and the second dam area DMA2.

In an example embodiment, the dam part DMA may include the blocking part BP in which the first and second organic insulating layers 121 and 122 are removed between the second dam area DMA2 and the third dam area DMA3.

At least one first dam DM1 may be disposed in the first dam area DMA1 and may extend in the second direction D2.

At least one second dam DM2 may be disposed in the second dam area DMA2, may be adjacent to the at least one first dam DM1 in the first direction D1, and may extend in the second direction D2.

At least one third dam DM3 may be disposed in the third dam area DMA3, may be adjacent to the at least one second dam DM2 in the first direction D1, and may extend in the second direction D2.

In an example embodiment, as shown in FIG. 9, the first dam area DMA1 may include a plurality of first dams DM1 and a plurality of step parts STP2.

The plurality of first dams DM1 and the plurality of step parts STP2 may be on the first interlayer insulating layer 116. A lower layer structure of the first interlayer insulating layer 116 may include the buffer layer 111, the gate insulating layer 113 and the gate metal pattern GM sequentially stacked on the substrate 110.

The first height h1 of the first dam DM1 may be determined as a stacked thickness of the first source metal pattern SM1, the first organic insulating layer 121, the second source metal pattern SM2, the second organic insulating layer 122 and the pixel definition layer 123.

The second height h2 of the step part STP2 may be determined as a stacked thickness of one of the first and second source metal patterns SM1 and SM2, the first organic insulating layer 121 and the pixel definition layer 123.

The second dam DM2 may be disposed in the second dam area DMA2.

The second dam DM2 may be on the first interlayer insulating layer 116. A lower layer structure of the first interlayer insulating layer 116 may include the buffer layer 111, the gate insulating layer 113 and the gate metal pattern GM sequentially stacked on the substrate 110.

A first height of the second dam DM2 may be determined as a stacked thickness of the first source metal pattern SM1, the first organic insulating layer 121, the second source metal pattern SM2, the second organic insulating layer 122, and the pixel definition layer 123.

The third dam DM3 may be disposed in the third dam area DMA3.

The third dam DM3 may be on the first interlayer insulating layer 116. A lower layer structure of the first interlayer insulating layer 116 may include the buffer layer 111, the gate insulating layer 113, and the gate metal pattern GM sequentially stacked on the substrate 110.

A first height of the third dam DM3 may be determined as a stacked thickness of a first source metal pattern SM1, the first organic insulating layer 121, the second source metal pattern SM2, the second organic insulating layer 122, and the pixel definition layer 123.

The organic layer 132 of the encapsulation layer 130 may be prevented from flowing to the edge portion of the display device by the step part STP2 and the first dam DM1 of the first dam area DMA1. In addition, the organic layer 132 of the encapsulation layer 130 may be prevented from flowing to the edge portion of the display device by the second dam DM2 of the second dam area DMA2. In addition, the organic layer 132 of the encapsulation layer 130 may be prevented from flowing to the edge portion of the display device by the third dam DM3 of the third dam area DMA3.

According to an example embodiment, a display device includes a blocking part in which an organic layer is removed from an area between a first dam area and a second dam area, or between the second dam area and a third dam area. Therefore, the outside air such as moisture and oxygen may be prevented from entering the display part through the organic layer and the organic layer formed on the edge portion of the display device.

Example embodiments may be applied to a display device and an electronic device having the display device, for example, a computer monitor, a laptop, a digital camera, a cellular phone, a smart phone, a smart pad, a television, a personal digital assistant (PDA), a portable multimedia player (PMP), a MP3 player, a navigation system, a game console, a video phone, etc.

By way of summation and review, when impurities such as moisture and/or oxygen enter into a display device from outside, a lifetime of an electric device included in the display device may be shortened. In the case of an organic light emitting display device, the efficiency of light emission of the organic light emitting layer may be reduced. In this case, deterioration of emission color of the organic light emitting layer may occur.

Accordingly, when manufacturing the display device, sealing processes may be performed so that an internal electric element is isolated from the outside to prevent impurities from penetrating. The sealing processes include a method of laminating a layer made of an organic polymer on a lower substrate on which a thin film transistor, an organic light emitting layer and the like are formed, a method of forming a cover or a cap with an encapsulating substrate and sealing the edges of the lower substrate and the encapsulating substrate, and a method of forming an encapsulation member including a plurality of encapsulating layers instead of the encapsulating substrate.

As described above, embodiments relate to a display device having a dam formed in a peripheral area adjacent to a display area. Example embodiments may provide a display device for blocking outside air.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A display device, comprising:
a display part including a plurality of pixels arranged on a substrate;
a plurality of dams in a first peripheral part adjacent to the display part, the plurality of dams being extended in a longitudinal direction of the first peripheral part and arranged in a direction crossing the longitudinal direction, the plurality of dams including a stack of a first organic insulating layer and a second organic insulating layer;

at least one source metal pattern disposed within one of the plurality of dams, the at least one source metal pattern being extended in the longitudinal direction; and
a blocking part disposed between the plurality of dams and corresponding to a removed portion of the first and second organic insulating layers.

2. A display device, comprising:
a display part including a plurality of pixels arranged on a substrate;
a plurality of dams in a first peripheral part adjacent to the display part, the plurality of dams being extended in a longitudinal direction of the first peripheral part and arranged in a direction crossing the longitudinal direction, the plurality of dams including a stack of a first organic insulating layer and a second organic insulating layer; and
a blocking part disposed between the plurality of dams and corresponding to a removed portion of the first and second organic insulating layers, wherein:
at least one power voltage line which transmits a power supply voltage applied to the plurality of pixels is disposed in the first peripheral part,
the at least one power voltage line includes a first source metal pattern and a second source metal pattern connected to the first source metal pattern through a contact hole formed in the first organic insulating layer, and
the second organic insulating layer is on the second source metal pattern.

3. The display device as claimed in claim 2, wherein the plurality of dams includes:
at least one first dam in a dam area adjacent to the display part;
a second dam adjacent to the first dam; and
a third dam adjacent to the second dam.

4. The display device as claimed in claim 3, wherein the first, second, and third dams are on the at least one power voltage line and partially overlap with the at least one power voltage line.

5. The display device as claimed in claim 3, wherein the blocking part is in an area where the at least one power voltage line is not formed between the first dam and the second dam.

6. The display device as claimed in claim 3, wherein the blocking part is in an area where the at least one power voltage line is not formed between the second dam and the third dam.

7. The display device as claimed in claim 3, wherein each of the plurality of pixels includes a pixel circuit with each pixel circuit including:
a transistor including an active pattern, a gate electrode, a source electrode, and a drain electrode;
an organic light emitting diode connected to the transistor, the organic light emitting diode including a pixel electrode, a light emitting layer, and a common electrode; and
a pixel defining layer including an opening in which the light emitting layer is disposed, wherein
the first and second organic insulating layers are between the source electrode and the pixel electrode.

8. The display device as claimed in claim 7, wherein:
each of the first, second and third dams have a first height, and
the first height corresponds to a stacked thickness of the first source metal pattern, the first organic insulating layer, the second source metal pattern, the second organic insulating layer, and the pixel defining layer.

9. The display device as claimed in claim 7, wherein:
the first dam has a first height and a step part disposed in the dam area,
the step part has a second height lower than the first height,
the step part is adjacent to the display part, and
the first dam is adjacent to the second dam.

10. The display device as claimed in claim 9, wherein the second height of the step part corresponds to a stacked thickness of the first or second source metal pattern, the first organic insulating layer, and the pixel defining layer.

11. The display device as claimed in claim 7, wherein:
the plurality of dams include a plurality of first dams disposed in the dam area, each first dam having a first height and a step part, and
each step part has a second height lower than the first height and is disposed between the plurality of first dams.

12. The display device as claimed in claim 11, wherein the second height of the step part corresponds to a stacked thickness of the first source metal pattern, the first organic insulating layer, and the second source metal pattern.

13. The display device as claimed in claim 11, wherein the second height of the step part corresponds to a stacked thickness of the first or second source metal pattern, the first organic insulating layer, and the pixel defining layer.

14. The display device as claimed in claim 7, further comprising an encapsulation layer on the common electrode of the display part.

15. The display device as claimed in claim 14, wherein the encapsulation layer includes a sequential stack of an inorganic layer, an organic layer, and an inorganic layer.

16. The display device as claimed in claim 14, further comprising:
a first touch electrode of a touch sensor on the encapsulation layer of the display part;
a second touch electrode of the touch sensor on the first touch electrode of the display part; and
an interlayer insulating layer between the first touch electrode and the second touch electrode.

17. The display device as claimed in claim 2, wherein the substrate includes a plurality of plastic layers.

18. A display device, comprising:
a display part including a plurality of pixels arranged on a substrate;
a plurality of dams in a first peripheral part adjacent to the display part, the plurality of dams being extended in a longitudinal direction of the first peripheral part and arranged in a direction crossing the longitudinal direction, the plurality of dams including a stack of a first organic insulating layer and a second organic insulating layer;
a blocking part disposed between the plurality of dams and corresponding to a removed portion of the first and second organic insulating layers;
a pad part located at the first peripheral part and including a plurality of pads connected to an external circuit film; and
a bending part located at the first peripheral part between the display part and bending.

19. The display device as claimed in claim 18, wherein the plurality of dams are disposed between the display part and the bending part.

20. The display device as claimed in claim 18, further comprising a valley part disposed in a second peripheral part surrounding the display part except for the first peripheral part, the valley part corresponding to a removed portion of the first and second organic insulating layers in second peripheral part.

* * * * *